United States Patent
Kim et al.

(10) Patent No.: US 6,936,533 B2
(45) Date of Patent: Aug. 30, 2005

(54) METHOD OF FABRICATING SEMICONDUCTOR DEVICES HAVING LOW DIELECTRIC INTERLAYER INSULATION LAYER

(75) Inventors: Jae-Hak Kim, Seoul (KR); Hong-Jae Shin, Seoul (KR); Soo-Geun Lee, Kyunggi-do (KR); Kyoung-Woo Lee, Seoul (KR)

(73) Assignee: Samsung Electronics, Co., Ltd. (KR)

( * ) Notice: Subject to any disclaimer, the term of this patent is extended or adjusted under 35 U.S.C. 154(b) by 441 days.

(21) Appl. No.: 09/994,508

(22) Filed: Nov. 27, 2001

(65) Prior Publication Data
US 2002/0106891 A1 Aug. 8, 2002

(30) Foreign Application Priority Data

Dec. 8, 2000 (KR) ......................................... 2000-74836
Jun. 27, 2001 (KR) ................................ 10-2001-0036933

(51) Int. Cl.$^7$ ..................... H01L 21/4763; H01L 21/31; H01L 23/58
(52) U.S. Cl. ...................... 438/623; 438/778; 438/781; 438/783; 257/635; 257/637
(58) Field of Search ............................... 438/623, 778, 438/783, 781; 257/635, 637

(56) References Cited

U.S. PATENT DOCUMENTS

| 5,399,441 | A | * | 3/1995 | Bearinger et al. ........... 428/689 |
| 5,689,565 | A | * | 11/1997 | Spies et al. .................. 437/192 |
| 5,818,071 | A | * | 10/1998 | Loboda et al. ................ 257/77 |
| 5,866,197 | A | * | 2/1999 | Bremmer et al. .............. 427/96 |
| 5,906,859 | A | * | 5/1999 | Bremmer et al. ........... 427/226 |
| 5,926,740 | A | * | 7/1999 | Forbes et al. ................ 438/763 |
| 6,159,871 | A | * | 12/2000 | Loboda et al. ............... 438/786 |
| 6,165,892 | A | * | 12/2000 | Chazan et al. ............... 438/623 |
| 6,251,802 | B1 | * | 6/2001 | Moore et al. ................ 438/778 |
| 6,313,518 | B1 | * | 11/2001 | Ahn et al. .................. 257/632 |
| 6,350,704 | B1 | * | 2/2002 | Ahn et al. ................... 438/778 |

FOREIGN PATENT DOCUMENTS

JP         20118554      *  7/2001

OTHER PUBLICATIONS

Townsend, P.H., et al., "SiLK Polymer Coating with Low–Dielectric Constant and High Thermal Stability for ULSI Interlayer Dielectric," Materials Research Society Symp. Proc. vol. 476, 1997, pp. 9–17.
Kudo, H., et al., "Copper Dual Damascene Interconnects with Very Low–k Dielectrics Targeting for 130nm Node," IEEE, 2000, pp. 270–272.

* cited by examiner

*Primary Examiner*—Long Pham
*Assistant Examiner*—Shrinivas H. Rao
(74) *Attorney, Agent, or Firm*—Mills & Onello LLP (57) ABSTRACT

A method of fabricating a semiconductor device having a low dielectric constant is disclosed. According to the method, a silicon oxycarbide layer is formed, treated with plasma, and patterned. The silicon oxycarbide layer is formed by a coating method or a CVD method such as a PECVD method. Treating the silicon oxycarbide layer with plasma is performed by supplying at least one gas selected from a group of He, $H_2$, $N_2O$, $NH_3$, $N_2$, $O_2$ and Ar. It is desirable that plasma be applied at the silicon oxycarbide layer in a PECVD device by an in situ method after forming the silicon oxycarbide layer. In a case in which a capping layer is further stacked and patterned, it is desirable to treat with $H_2$-plasma. Even in a case in which an interlayer insulation is formed of the silicon oxycarbide layer and a coating layer of an organic polymer group for a dual damascene process, it is desirable to perform the plasma treatment before forming the coating layer.

18 Claims, 7 Drawing Sheets

METHOD OF FABRICATING SEMICONDUCTOR DEVICES HAVING LOW DIELECTRIC INTERLAYER INSULATION LAYER

RELATED APPLICATION

This application relies for priority upon Korean Patent Applications Nos. 2001-36933, filed on Jun. 27, 2001 and 2000-74836, filed on Dec. 8, 2000, the contents of which are herein incorporated by reference in their entirety.

FIELD OF THE INVENTION

The present invention relates to a method of fabricating a semiconductor device having a low dielectric layer, and more particularly to a semiconductor device having a silicon oxycarbide layer.

BACKGROUND OF THE INVENTION

As semiconductor devices become more highly integrated, sizes of individual devices and wires or interconnects become smaller. Also, the distance between devices or wires becomes smaller. Thus, parasitic capacitance between a conductive region and wires increases and impedes normal function of the semiconductor devices. For example, if the parasitic capacitance is increased, resistance capacitance (RC) delay is further created in a signal transfer of a semiconductor device. The RC delay degrades performance characteristics of the semiconductor device and distorts signals being transferred among or within devices. Various approaches have been studied in order to prevent the above problems.

In order to reduce the problems associated with the parasitic capacitance such as the RC delay, there is a method of using a low dielectric layer as a layer which forms structure in a semiconductor device, i.e., an interlayer insulation layer between wires. The low dielectric layer has a low dielectric constant relative to that of a conventional insulation layer used in a semiconductor device. For example, a relative dielectric constant of a silicon nitride layer has a high value of about 8 and that of a silicon oxide layer is 3.7 to 4. The silicon nitride layer is generally used as an etch stopping layer, a capping layer, or a spacer, and the silicon oxide layer is most frequently used as an interlayer insulation layer.

As a material for the low dielectric layer, there are used a layer of organic polymer group and a silicon oxide layer of hydrosilsesquioxane (HSQ) and methylsilsesquoxan (MSQ) formed by a spin on glass (SOG) method, and moreover a silicon oxycarbide layer (SiOC). But, in comparison with a conventional thermal oxide layer and a chemical vapor deposition (CVD) oxide layer, the silicon oxide layer of the SOG group doesn't have a high value of a relative dielectric constant, and it is not easy to finely treat the silicon oxide layer. Thus, there is a problem that it is difficult to form a contact hole or a trench for interconnection by a damascene process because of an inferior etching characteristic. Also, because the curing is not perfect, the silicon oxide layer of the SOG group may absorb water or is polluted in a subsequent step.

The silicon oxycarbide layer may be regarded as the same material with the carbon-doped silicon oxide layer and formed by coating methyl silsesquioxane (MSSQ) by the SOG method or employing a plasma enhanced chemical vapor deposition (PECVD) method by supplying a gas containing silicon and other organic compound of methyl silane group, a source gas containing oxygen atoms from $N_2O$ and $O_2$, and a carrier gas selected from $N_2$, $NH_3$, He and Ar. The methyl silane group is formed by substituting a carbon group such as a methyl group ($CH_3$—) for one or more hydrogen of silane ($SiH_4$) gas. The relative dielectric constant of the silicon oxycarbide layer is 2.7 to 2.9, and in case that other variable is constant, it is possible to decrease 25% to 30% of the parasitic capacitance by using the silicon oxycarbide layer instead of the silicon oxide.

Figure 1:
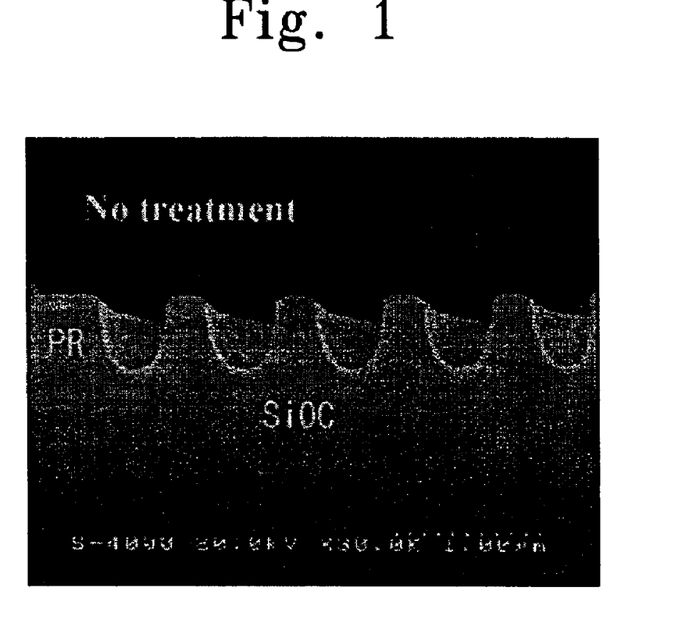
FIG. 1 is an electron microscope image illustrating a conventional footing phenomenon in which a portion of photoresist remains at the side and bottom of a photoresist pattern during patterning of a silicon oxycarbide layer.

There are several drawbacks to using the silicon oxycarbide layer as an interlayer insulation layer. First, with respect to patterning, there is a footing phenomenon of a photoresist pattern formed on the silicon oxycarbide layer. During forming the silicon oxycarbide layer, nitrogen atoms from a source gas or a carrier gas are partially included in the silicon oxycarbide layer. When a photolithography process is performed for patterning the silicon oxycarbide layer, the nitrogen atoms included in the layer are combined with hydrogen ions created when the photoresist is exposed to light, thereby interfering with the reaction that polymer of resin component is formed in the photoresist or with the inverse reaction. As a result, even after developing, the photoresist pattern is not clearly formed and a part of the photoresist remains at the side and bottom of the photoresist pattern like FIG. 1. That is, a footing phenomenon may occur.

The footing phenomenon seriously influences a chemical amplification type photoresist which is frequently being used for forming fine patterns in the formation of a highly integrated semiconductor device. Hydrogen ions are generated by a sensitizer in the photoresist by a sensitization reaction. After sensitization and before development, in a post-exposure bake, the initially generated hydrogen ion induces decomposition or combination reaction of large quantity of polymer related to the resin component in the peripheral photoresist by heat at the chemical amplification type photoresist. In the step, more hydrogen ions can be generated. But, if a small number of the initially generated hydrogen ions are combined with nitrogen included in the silicon oxycarbide layer below the photoresist, although the post-exposure bake is performed, it is impossible to induce a large amount of chemical reaction. Thus, where the photoresist contacts with the silicon oxycarbide layer, the photoresist that should be removed remains even after development because of lack of reaction.

Related to an ashing process, in a step of removing the photoresist pattern used as an etch mask, an ashing process is performed using $O_2$-plasma. At this time, there is a problem that the silicon oxycarbide layer of the interlayer insulation layer is degenerated and damaged by $O_2$-plasma. In case that the silicon oxycarbide layer reacts with the $O_2$-plasma, the relative dielectric constant of the silicon oxycarbide layer is increased up to the similar level with the silicon oxide layer.

In case of the damascene process, the silicon oxycarbide layer is patterned, a trench or a contact hole is filled with a conductive material and then a chemical mechanical polishing (CMP) process is necessarily performed to expose the silicon oxycarbide layer. The characteristic of the silicon oxycarbide layer is mechanically weak so that the phenomena of a micro scratch and lifting frequently occur at the surface of the silicon oxycarbide layer in the CMP process for the damascene process.

Another problem of the silicon oxycarbide layer is a low adhesive force with another layer stacked thereon. Thus, the other layer is not uniformly formed or the stacked layer on the silicon oxycarbide layer is easy to be lifted.

Related to the above problems of the silicon oxycarbide layer, first, a method of eliminating the problem associated with the ashing process can be considered. For example, a hard mask is used and removed together with the photoresist pattern for the low dielectric layer not to be exposed at the $O_2$-plasma for ashing, or the photoresist pattern is removed under the ambient of $H_2$ and $N_2$. The latter method is a forming gas ashing method. But, these methods degrade the process efficiency. Also, the problem of mechanical damage in the CMP process still remains.

Related to the increase in the dielectric constant by ashing and the mechanical damage, it is possible to consider a problem that another insulation layer is thinly stacked on the silicon oxycarbide layer. By using the insulation layer, it is possible to prevent the degeneration and damage of the silicon oxycarbide layer resulting from ashing with the $O_2$-plasma and the direct damage of the silicon oxycarbide layer resulting from the CMP process. But, in case that the silicon oxide layer is stacked on the silicon oxycarbide layer using a silane gas or a tetraethyl orthosilicate (TEOS) gas as a source gas by employing the PECVD method, another problem occurs. That is, the silicon oxycarbide layer has a weak adhesive force with these insulation layers so that these layers are easily lifted in the CMP process.

For more examples related to the adhesive force of the silicon oxycarbide layer, it is possible to consider a case of using a material of an organic polymer group as a layer of a low dielectric constant interlayer insulation layer with the silicon oxycarbide layer. In this case, as the material of the organic polymer group used at a semiconductor device, there are the SiLK and FLARE that are trademarks of the Dow Chemical Company and the Alliedsignal Company, respectively (Refer to "Materials Research Society," *Mat. Res. Soc. Sym. Proc.*, Vol.476, 1997). The SiLK and FLARE are developed in order to be used as a low dielectric constant interlayer insulation layer. In the event that a material of the organic polymer group is purely used as an interlayer insulation layer and the damascene process is applied, the formed layer has a low thermal characteristic such as a thermal conductivity and an inferior mechanical characteristic. In order to solve this problem, an interlayer insulation layer can be formed of two kinds of layers which are compensative to each other. For example, the interlayer insulation layer of a bottom where a contact hole is formed can be formed of a silicon oxide layer and the interlayer insulation layer of a top where a trench for interconnection is formed can be formed of a layer of the organic polymer group. However, the layer of the organic polymer group is formed by employing a coating method such as that disclosed in IEEE 2000, "Copper Dual Damascene Interconnects with Very Low-k Dielectrics Targeting for 130 nm Node."

At this time, if the silicon oxycarbide layer can be used as the interlayer insulation layer of the bottom, it will be desirable. But, in this case, the silicon oxycarbide layer has a low adhesive force so that the coated organic polymer layer is not uniformly formed and a process failure is induced. Particularly, there is a problem that a coating layer is easily lifted or thickness of the coating layer is not uniform at the peripheral part of a wafer.

SUMMARY OF THE INVENTION

It is an object of the present invention to provide a method of fabricating a semiconductor device that can form a clear photoresist pattern without a footing phenomenon even in a case of using a chemical amplification type photoresist on a silicon oxycarbide layer.

Also, it is another object of the present invention to provide a method of fabricating a semiconductor device having no increase in dielectric constant of a silicon oxycarbide layer even in a case of removing a photoresist pattern used for patterning the silicon oxycarbide layer using ashing.

It is still another object of the present invention to provide a method of fabricating a semiconductor device that can prevent micro scratches, lifting and a process failure occurring in a CMP process where forming a contact and interconnection are formed at a silicon oxycarbide layer using a damascene process.

It is still another object of the present invention to provide a method of fabricating a semiconductor device that can prevent a process failure occurring by a coating failure or lifting of a coated layer when a CVD insulation layer or a coating insulation layer of an organic polymer group is formed on a silicon oxycarbide layer and a damascene process is performed.

The present invention is directed to a method of fabricating a semiconductor device. In accordance with the method, a silicon oxycarbide layer is formed at a substrate and is treated with plasma. Photoresist is stacked on the plasma-treated oxycarbide layer and the resultant structure is patterned.

In one embodiment, the silicon oxycarbide layer is formed by a CVD method such as a PECVD method by supplying a gas containing nitrogen atoms as a source gas or a carrier gas.

The plasma-treatment step with respect to the silicon oxycarbide layer can be formed by a method of supplying one or more gases selected from the group of He, $H_2$, $N_2O$, $NH_3$, $N_2$, $O_2$ and Ar in a substrate-loaded processing chamber. The supplied gas reaches the plasma state to form a plasma-ambient, and the plasma treatment is performed.

In one particular embodiment, it is desirable to use $H_2$-plasma for the plasma treatment. In the step of the $H_2$-plasma treatment, under the conditions of the PECVD, without a source gas for stacking a material layer, $H_2$ gas is supplied to form $H_2$-plasma and this $H_2$-plasma is applied on the surface of a wafer.

It is desirable to applying plasma including $H_2$-plasma by employing an in situ method since the process can be simplified. The application of plasma is performed by injecting $H_2$ or other source gas into the same chamber by the in situ method after forming the silicon oxycarbide layer in the PECVD equipment.

In one embodiment, after finishing the plasma treatment, a coating layer of an organic polymer group, an oxide layer formed by CVD, or a capping layer formed of a nitride layer can be formed.

In accordance with the invention, a photolithography process, which is used in patterning a silicon oxycarbide layer after finishing the plasma treatment, is a conventional photolithography process including stacking photoresist, performing a mask exposure and development. By patterning, a contact hole is formed or a contact hole and a trench for interconnection are formed like the damascene process.

Also, in the present invention, after the plasma treatment of the silicon oxycarbide layer and before patterning, the process, which further comprises forming a coating layer of an organic polymer group or a CVD oxide layer on the silicon oxycarbide layer, is especially useful in the case in which a conductive layer is stacked and the CMP process is further performed in a subsequent step.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DESCRIPTION OF PREFERRED EMBODIMENTS

Embodiment 1.

Figure 2:
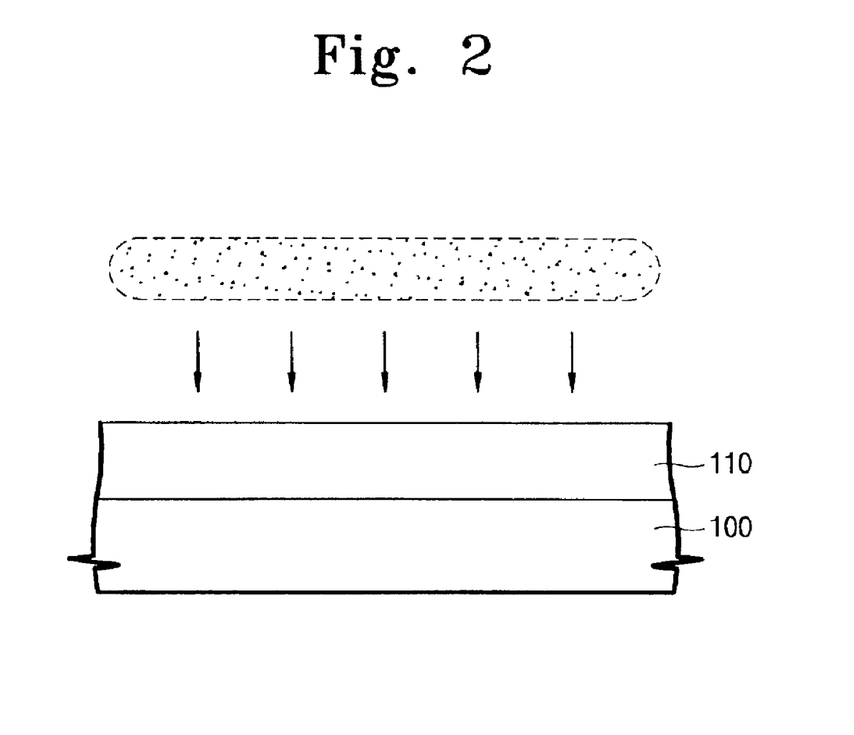
FIGS. 2 through 4 are schematic cross-sectional views illustrating parts of side cross-sectional views of a substrate at each step according to one embodiment of the method of the present invention.

Referring to FIG. 2, a silicon oxycarbide layer 110 is formed on a substrate 100 where a process of a former step is completed. In one embodiment, the silicon oxycarbide layer 110 is stacked as an interlayer insulation layer and formed by a PECVD method under a pressure of 1 to 10 Torr and a temperature of 300 to 400° C. As a source gas supplied for forming the silicon oxycarbide layer, there are $N_2O$ and $O_2$ for supplying $O_2$ and trimethyl silane for supplying silicon and carbon. Also, $N_2$ and Ar gases are used as a carrier gas. It is possible to use a methyl silane group of monomethyl silane, dimethyl silane, and tetramethyl silane, or other organic silicon gas, instead of the trimethyl silane.

Then, at the substrate 100 where the silicon oxycarbide layer 110 is formed, plasma treatment is performed to form a plasma-treated silicon oxycarbide layer 111. The plasma treatment can be performed by the in situ method in the PECVD chamber where the silicon oxycarbide layer 110 of the former step is formed. The process conditions can be similar to the case of forming the silicon oxycarbide 110 at the pressure of 10 Torr and a temperature of 300 to 400° C. As a plasma forming gas, there is one selected from the group of He, $H_2$, $N_2O$, $NH_3$, $N_2$, $O_2$ and Ar, or a combination of the above gasses.

However, the gas for the plasma treatment is not limited to the gases of the listed group. The source gas for plasma can combine nitrogen and hydrogen, remove nitrogen or form a stabilized nitride layer or other protection layer at the silicon oxycarbide layer. In one embodiment, the plasma-treatment time is 10 to 20 seconds.

Figure 3:
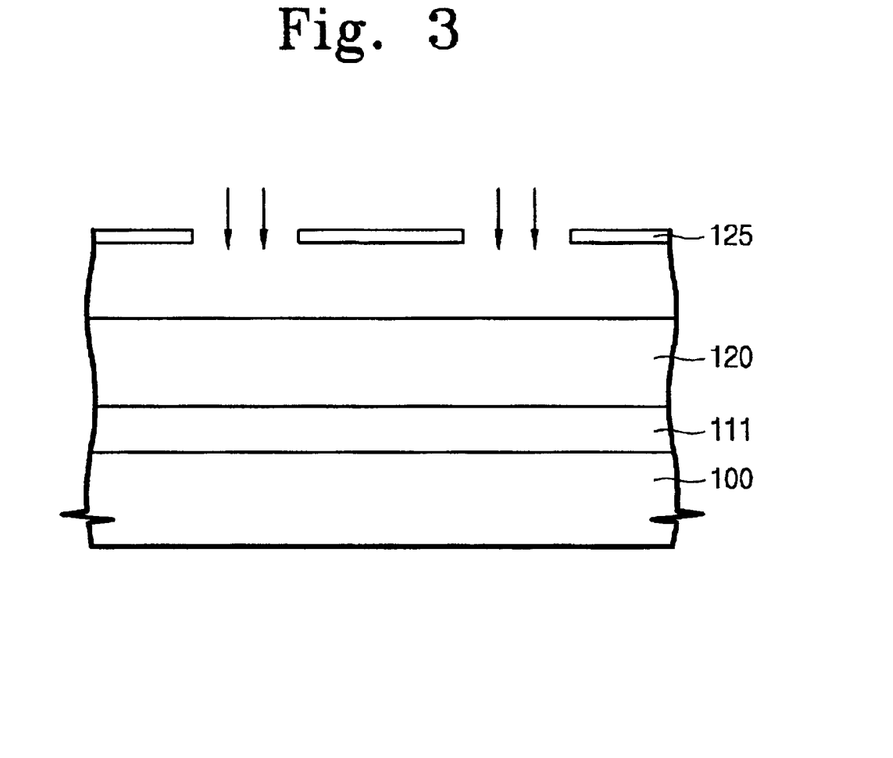

Referring to FIG. 3, a chemical amplification type photoresist layer 120 is coated on the plasma-treated silicon oxycarbide layer 111 by a spin coating method. The photoresist layer 120 is exposed to light under a photomask 125. A photochemical reaction occurs at the part exposed to light. If the photoresist is positive, the sensitizer generates hydrogen ions by the photochemical reaction.

In a subsequent step, as the light-exposed substrate is baked at the temperature of 80° C., a decomposition reaction of a resin polymer of the photoresist actively occurs at the light-exposed region, by heat and acid environment which is made by the already generated hydrogen ions.

Figure 4:
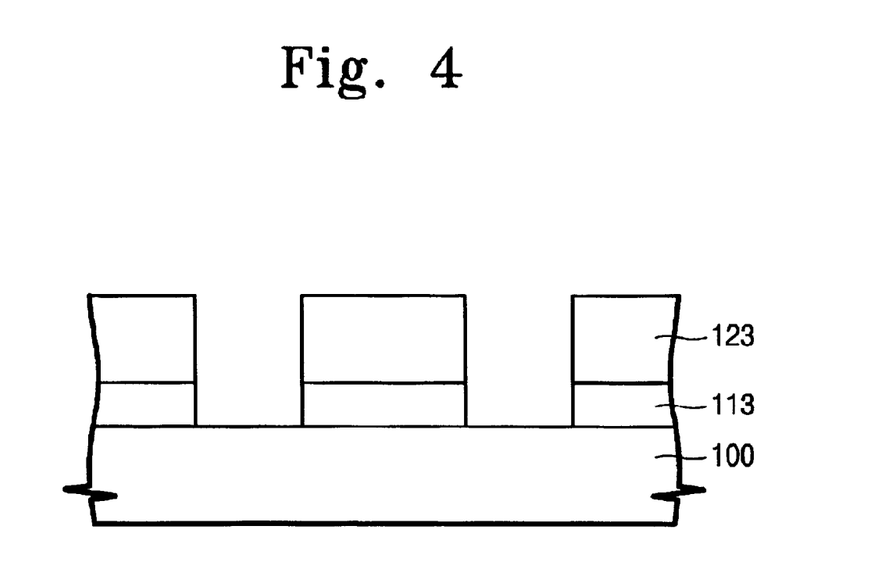

Referring to FIG. 4, after exposure to light and bake, development is performed to form a photoresist pattern 123. The photoresist decomposed at the developing step is dissolved in the developer, and the part not exposed to light only remains to form the photoresist pattern 123. The silicon oxycarbide layer of the bottom is etched using the photoresist pattern 123 as an etch mask to form a silicon oxycarbide layer pattern 113 having a contact hole.

Then, the photoresist pattern 123 is removed and the conductive layer is stacked on the substrate to fill the etched part such as the contact hole of the silicon oxycarbide layer.

Table 1 indicates the change of the relative dielectric constant resulting from performing the plasma treatment of several types under the same condition with the preferred embodiment after forming the silicon oxycarbide layer. Table 2 indicates the change of the relative dielectric constant with time in case of treating with He-plasma after forming the silicon oxycarbide layer.

TABLE 1

| Kinds of plasma treatment | Measured relative dielectric constant |
| --- | --- |
| Not treated case (Deposited state) | 2.84 |
| He-plasma treatment | 2.91 |
| $H_2$-plasma treatment | 2.87 |
| $N_2O$-plasma treatment | 2.91 |

TABLE 2

| Plasma treatment time (He-plasma treatment) | Measured relative dielectric constant |
| --- | --- |
| 0 (Deposited state) | 2.84 |
| 20 seconds | 2.91 |
| 40 seconds | 2.91 |
| 60 seconds | 2.90 |

Referring to the results shown in the above tables, the change of the relative dielectric constant of the silicon oxycarbide layer according to the type of plasma is low as the increasing rate below 2%. That is, the plasma treatment does not have a significant influence on the relative dielectric constant of the silicon oxycarbide layer. Thus, the silicon oxycarbide layer can be used as an interlayer insulation layer.

Referring to table 2, as the change of the relative dielectric constant according to the plasma treatment time is small in 2%, the plasma treatment process can have a sufficient margin. Also, if the treatment time is 10 seconds, the increase rate of the relative dielectric constant is almost zero.

Embodiment 2.

Figure 5:
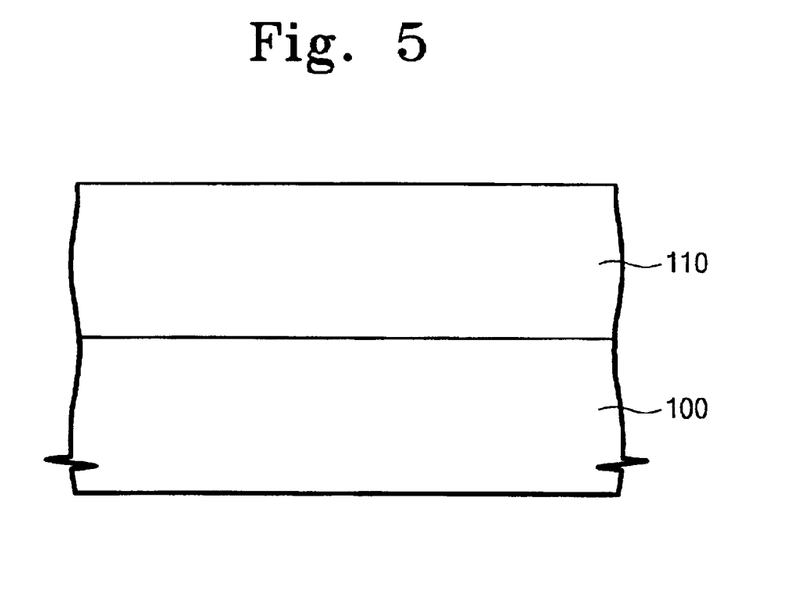
FIGS. 5 through 9 are cross-sectional views illustrating steps of a process according to another embodiment of the present invention.

Referring to FIG. 5, a silicon oxycarbide layer 110 is formed as an interlayer insulation layer at the substrate 100 where a bottom structure such as a MOSFET is formed. The silicon oxycarbide layer 110 is formed by the PECVD method, and as the source gas for forming the silicon oxycarbide layer 110, an organic silane such as the trimethylsilane is used. In one embodiment, conditions for the process are a temperature of 250 to 400° C. and a pressure of 1 to 10 Torr. Also, a radio frequency wave generating power of 13.6 MHz and 200 watts is applied at a CVD device processing 8-inch wafer by single piece in order to form plasma. The treatment time is controlled to achieve a desired thickness of the silicon oxycarbide layer 110.

Figure 6:
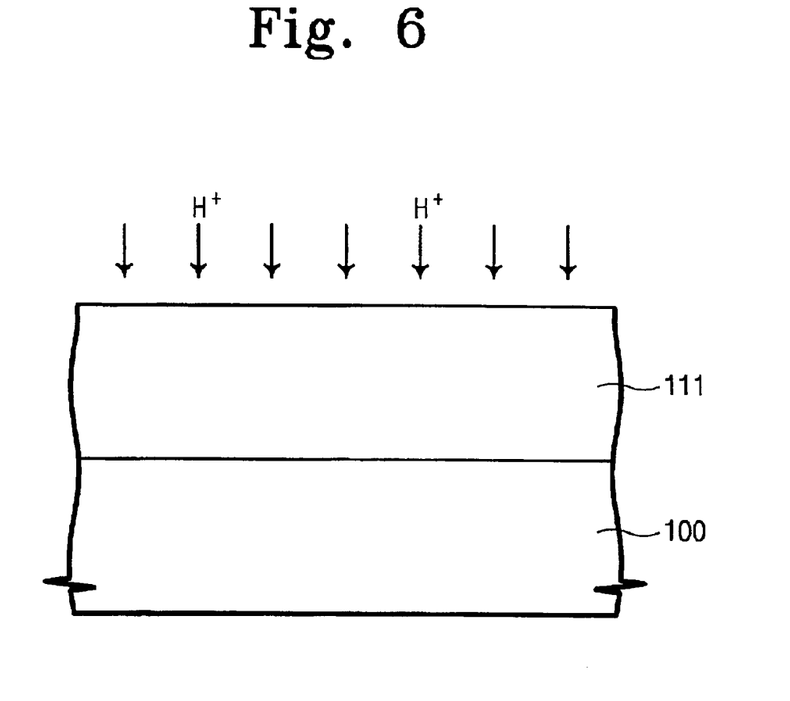

Referring to FIGS. 5 and 6, after stacking the silicon oxycarbide layer 110, $H_2$ is supplied as a treatment gas for generating $H_2$-plasma, and the generated $H_2$-plasma is applied on the surface of the substrate 100 where the silicon oxycarbide layer 110 is formed. The treatment condition of $H_2$-plasma is preferably similar with that for forming a PECVD layer except for a source gas. For example, the $H_2$-plasma treatment is performed under the conditions of a temperature of 250 to 400° C. and a pressure of 1 to 10 Torr. Also, a radio frequency wave generating power of 13.6 MHz and 200 watts is applied at the substrate for 10 to 200 seconds in the CVD device which processes 8-inch wafers by single piece. The treatment time can be changed according to the treatment condition of a subsequent process, but referring to an investigation with respect to characteristics of semiconductor devices formed, a silicon oxycarbide layer 111 whose surface is nearly saturated with hydrogen is formed through the treatment time of about 30 to 50 seconds.

When the $H_2$-plasma is applied on the silicon oxycarbide layer, the combination of a silicon atom and a hydrogen group and a dangling bond of silicon are removed, so that the surface has a combined structure of silicon atoms and hydrogen atoms. As a result, the mechanical strength of the silicon oxycarbide layer and the adhesive force with other layers are increased.

Figure 7:
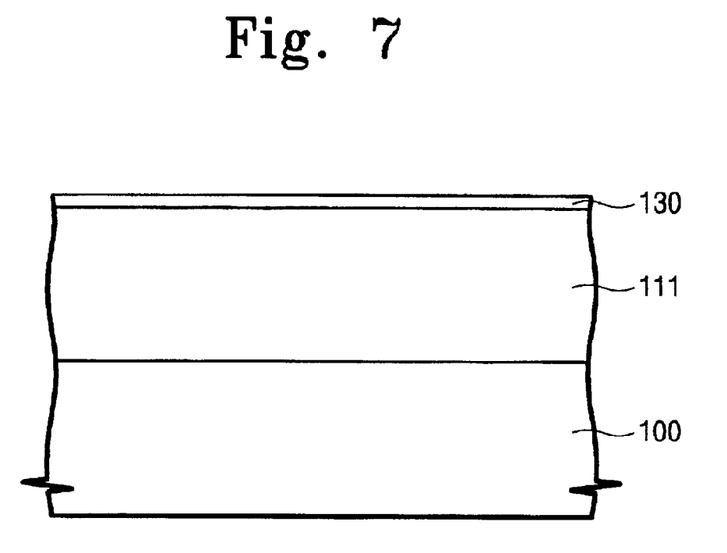

Referring to FIG. 7, after treating with $H_2$-plasma, by changing the source gas to TEOS or a silane gas, an oxide layer such as a plasma enhanced tetra ethylorthosilicate (PETEOS) is thinly formed on the $H_2$-plasma-treated silicon oxycarbide layer 111 as a capping layer 130. The process of FIGS. 5 to 7 is preferably performed by an in situ method in the same PECVD device since the production cost and time can be saved. Also, as a capping layer, a silicon nitride layer, a silicon oxynitride layer, or a silicon carbide layer can be used.

Figure 8:
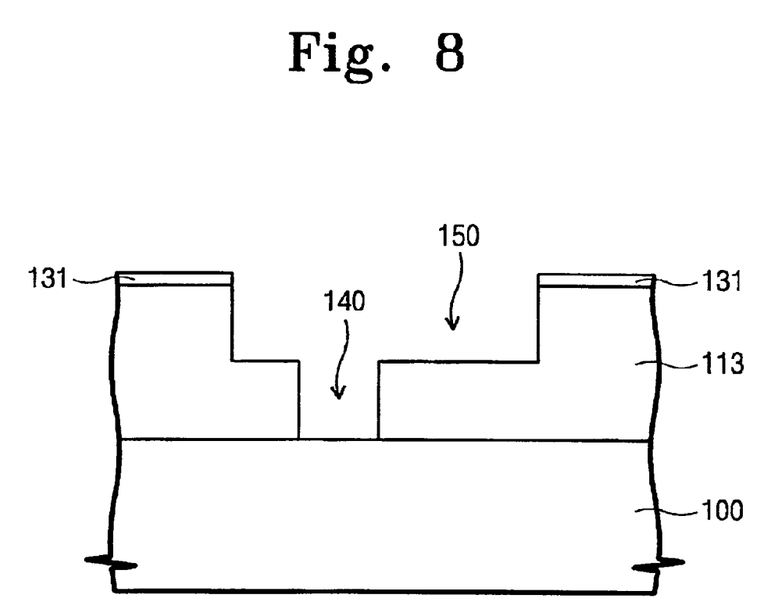

Referring to FIGS. 7 and 8, a groove 150 is formed for a metal interconnection at the top of the $H_2$-plasma-treated silicon oxycarbide layer 111 where the PETEOS oxide layer is covered with the capping layer 130. A dual damascene method process is performed to form a contact hole 140 at a contact region that is a part of the low surface of the groove 150. Alternatively, a contact plug is first formed, and then, an interlayer insulation layer is covered. A groove can be formed to expose the contact plug. The process of forming the groove 150 and the contact hole 140 includes the following steps. A photoresist pattern not illustrated is formed through photolithography, and then the capping layer 130 and the silicon oxycarbide layer 111 are selectively etched using the photoresist pattern as an etch mask. Then, ashing is performed in order to remove the photoresist pattern. The silicon oxycarbide layer 113 is covered with a capping layer pattern 131 except for the etched region, and treated with $H_2$-plasma so that it is possible to sustain a low dielectric constant despite the influence of $O_2$-plasma in the ashing.

Figure 9:
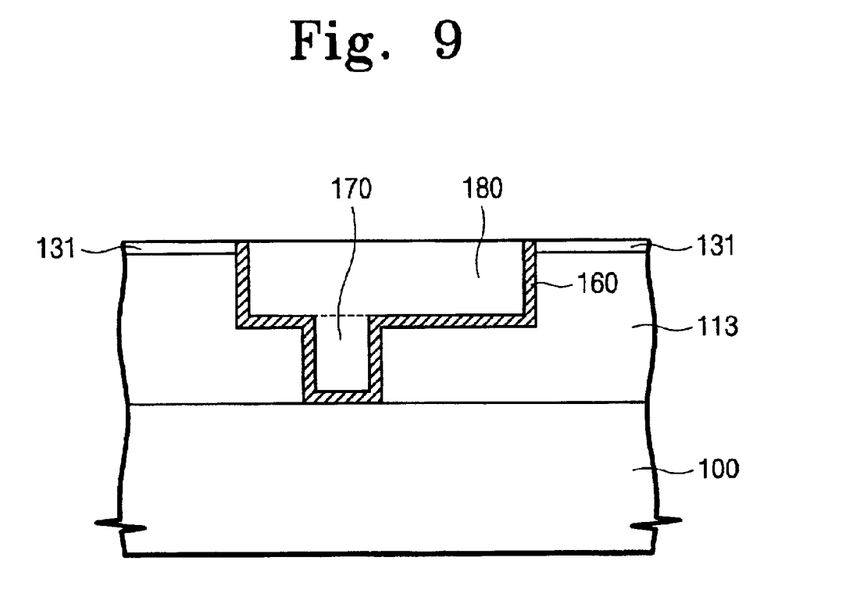

Referring to FIGS. 8 and 9, a Ti/TiN barrier metal layer and a CVD tungsten metal layer for interconnection are sequentially stacked on the substrate where the groove 150 and the contact hole 140 are formed. Then, the metal layer and the barrier metal layer are planarization-etched through a CMP process to expose the capping layer pattern 131. Thus, except for a metal pattern filling the groove 150 and the contact hole 140, the barrier metal layer and the metal layer for interconnection are removed, and an interconnection 180 and a contact plug 170 are formed. A barrier metal pattern 160 is formed adjacent to the contact plug 170, the interconnection 180 composed of the metal layer, and the silicon oxycarbide layer pattern 113. The capping layer pattern 131 is firmly adhered to the surface of the silicon oxycarbide layer pattern 113 through the $H_2$-plasma treatment with respect to the silicon oxycarbide layer, so that lifting of the capping layer pattern 131 can be prevented in the CMP process. However, the barrier metal layer stacked on the capping layer pattern 131 can be removed through a subsequent etching process apart from the planarization-etching process with respect to the metal layer, and even at this time, it is possible to prevent that the capping layer pattern 131 from being lifted since it is covered with the barrier metal in the CMP process with respect to the metal layer.

Embodiment 3.

Figure 10:
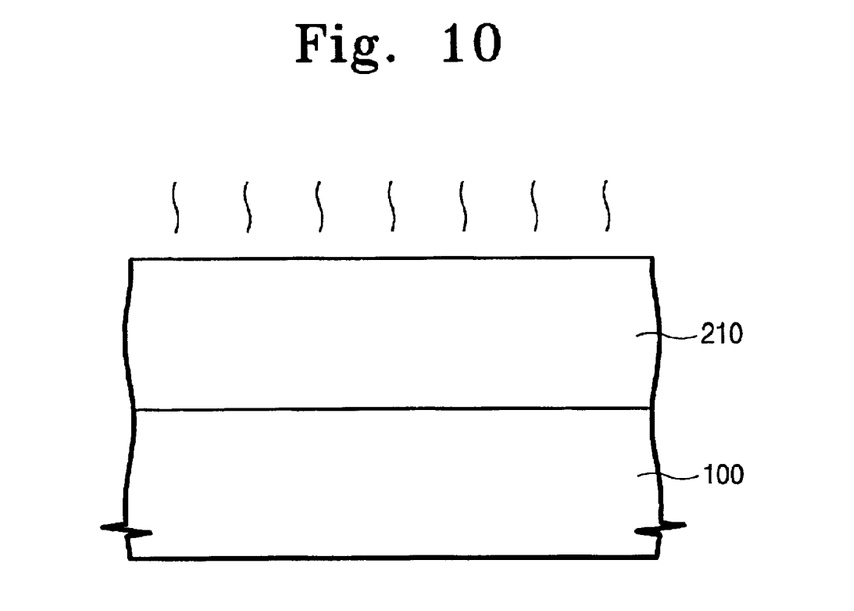
FIGS. 10 through 13 are cross-sectional views illustrating several steps of a process for forming an interlayer insulation layer of a silicon oxycarbide layer by a SOG method in accordance with the present invention.

Referring to FIG. 10, a SOL-type material including a methyl silsesquioxane (MSSQ) is coated at a substrate 100 where a transistor structure is formed, thereby stacking a silicon oxycarbide layer 210. After forming a layer by a coating technique, soft bake and hard bake processes are performed. The soft bake process is to remove its solvent and leave a solid-type material, and the hard bake process is to form a cured silicon oxycarbide layer 210.

Figure 11:
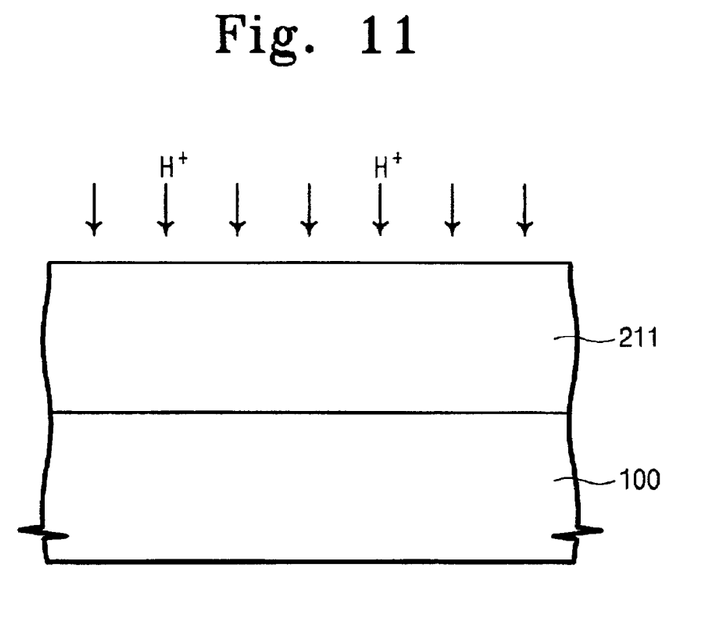

Referring to FIGS. 10 and 11, after forming the silicon oxycarbide layer 210, $H_2$ is supplied as a treatment gas to generate $H_2$-plasma, and the $H_2$-plasma is applied to the substrate 100 where the silicon oxycarbide layer 210 is formed. At the initial silicon oxycarbide layer 210, an organic group such as a methyl group readily combines with silicon atoms of the layer. But, at a silicon oxycarbide layer 211 which is treated with $H_2$-plasma, hydrogen atoms readily combine with silicon atoms. Thus, it is possible to reduce the increase in the dielectric constant of silicon oxycarbide layer and mechanical damage.

Figure 12:
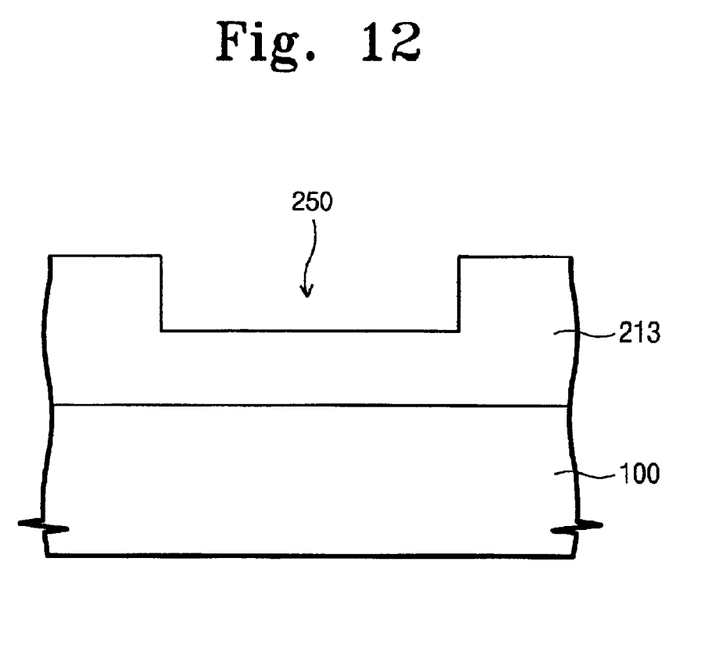

Referring to FIGS. 11 and 12, a groove 250 is formed at the top part of the $H_2$-plasma-treated silicon oxycarbide layer 211 to form a silicon oxycarbide layer pattern 213. More specifically, first, a photoresist pattern (not illustrated) is formed at the silicon oxycarbide layer 211 and the resultant structure is etched to form the groove 250 at the interconnection region. The photoresist pattern is removed by ashing. $O_2$-plasma is used for ashing, but the silicon oxycarbide layer 211 was already treated with $H_2$-plasma, so that the increase in dielectric constant of silicon oxycarbide layer during ashing is low.

Figure 13:
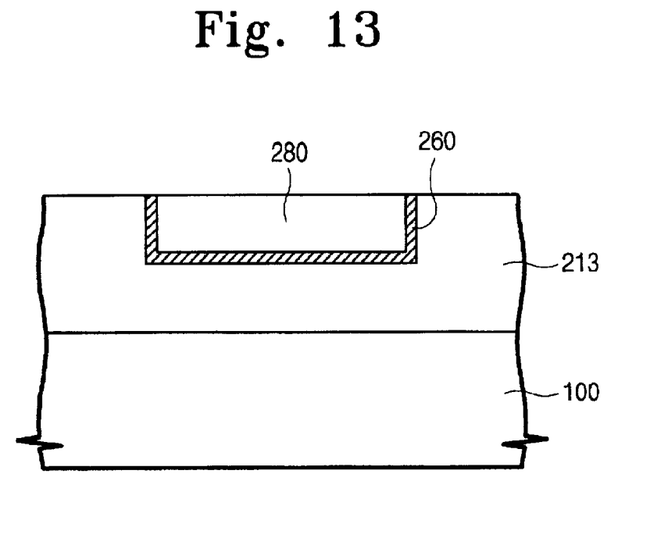

Referring to FIGS. 12 and 13, the groove 250 is filled with a barrier metal and Cu-metal, and by this, the damascene process is completed. More specifically, a barrier metal layer and a Cu-metal layer are stacked over the silicon oxycarbide layer pattern 213 to fill the groove 250. The barrier metal layer and Cu-metal layer stacked on the silicon oxycarbide layer pattern 213 except in the groove 250 are removed by employing the CMP method. Thus, the top surface of the silicon oxycarbide layer pattern 213 is exposed and an interconnection composed of a barrier metal pattern 260 and a metal pattern 280 is formed. The silicon oxycarbide layer pattern 213 whose surface is already treated with $H_2$-plasma, is strong under mechanical scratching, so that the silcon oxycarbide layer pattern 213 is not easily damaged in the CMP process. Thus, it is possible to prevent particle generation by abnormal lifting in the process and a process failure of a semiconductor device.

Figure 14:
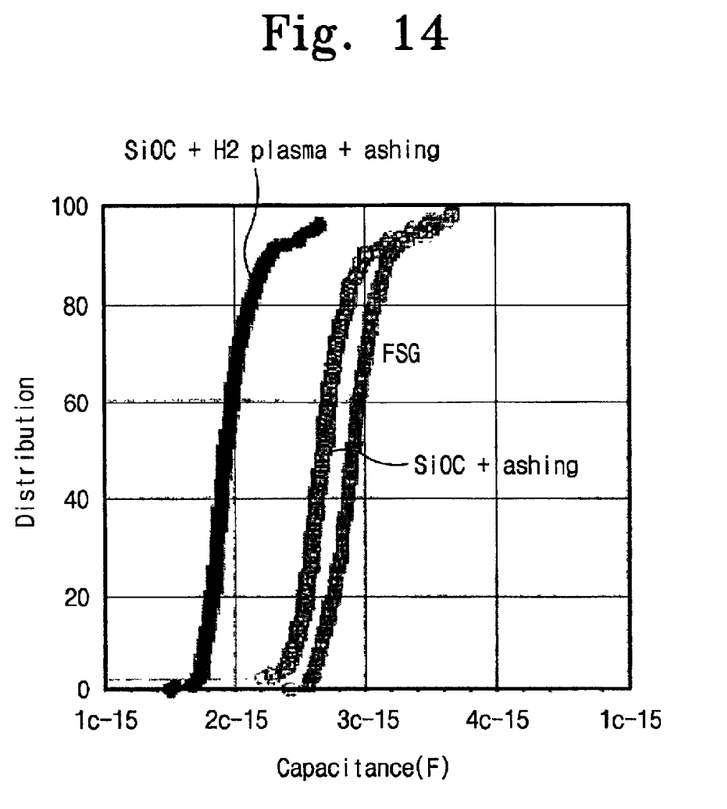
FIG. 14 is a graph illustrating a cumulated distribution of parasitic capacitance comparing embodiments of the present invention.

FIG. 14 is a graph comparing the values of parasitic capacitance of semiconductor device when three kinds of materials are alternatively used as the interlayer insulation layer. Here, as the interlayer insulation layer, a silicon oxide layer (FSG) containing a fluorine component, a $O_2$-plasma-treated silicon oxycarbide layer (SiOC), and a $H_2$-plasma-treated silicon oxycarbide layer (SiOC) of the present invention are used. According to the graph, when a silicon oxycarbide layer is formed of a low dielectric layer and exposed to $O_2$-plasma in the ashing process, the silicon oxycarbide layer has the equal or somewhat lower relative dielectric constant in comparison with the silicon oxide layer containing fluorine. But, in the case of performing the $H_2$-plasma treatment before ashing like the present invention, despite of being exposed to $O_2$-plasma in the subsequent ashing process, the silicon oxycarbide layer has the relative dielectric constant which is lower than that of the silicon oxide layer containing fluorine, and which is the same level as at initial formation. According to the result of the present invention illustrated in the graph of FIG. 14, it is possible to decrease 15 to 30% of the parasitic capacitance in comparison with the conventional silicon oxycarbide that is not treated with $H_2$-plasma.

Table 3 indicates the results of investigating whether a capping layer is lifted, in case of performing the CMP process using two kinds of slurries after the silicon oxycarbide is formed to a thickness of 5,000 Å at the entire surface of an experimental wafer and a capping layer is stacked. Five cases are illustrated in which five different capping layers are used to cap the silicon oxycarbide. The five cases include: (1) a silicon oxide containing fluorine (FSG), (2) a PECVD oxide layer (PETEOS) using a TEOS gas, (3) another PECVD oxide layer (PEOX) using a silane gas, (4) an oxide layer ($NH_3$-plasma+TEOS) using the TEOS after $NH_3$-plasma treatment, and (5) another oxide layer ($H_2$-plasma+TEOS) using the TEOS gas after $H_2$-plasma treatment.

TABLE 3

| Slurry/Capping | FSG | PETEOS | PEOX | $NH_3$-plasma + TEOS | $H_2$-plasma + TEOS |
|---|---|---|---|---|---|
| Slurry 1 | Normal | All lifting | Lifting | Lifting | Normal |
| Slurry 2 | Normal | Lifting | Lifting | Normal | Normal |

Referring to the investigation of using the In Line SEM (ILS), a main process defect is a micro scratch. As a result, in case of treating a surface with plasma before forming a capping layer, it is possible to prevent lifting of a capping layer and more particularly, in case of treating a surface with $H_2$-plasma like the present invention, it is possible to prevent lifting more reliably.

Embodiment 4.

A silicon oxycarbide layer is formed at a substrate as an interlayer insulation layer. As as the formation method of the silicon oxycarbide layer, it is possible to employ a coating method or a CVD method such as a PECVD method but desirable to employ the PECVD method. Then, under the same ambient as that of the PECVD process, a gas for a plasma treatment is injected without a source gas for forming a layer. Thus, plasma is generated from $NH_3$, $H_2$, $N_2$ and $O_2$ and applied at the surface of a wafer. The surface of the silicon oxycarbide layer is regenerated. A layer of an organic polymer group is formed over the regenerated surface. The layer of the organic polymer group is formed by the coating method and after coating, the layer is cured through a curing process at a temperature of 400 to 450° C. As the organic polymer layer, it is desirable to use a material having a low dielectric constant and thermal and mechanical characteristics of a semiconductor interlayer insulation layer such as those under the trademarks of SiLK and FLARE. By treating the silicon oxycarbide layer with plasma, the organic polymer layer can be uniformly coated on the silicon oxycarbide layer.

When the silicon oxycarbide layer and the organic polymer layer are continuously stacked to form an interlayer insulation layer, the exposed organic polymer layer is etched to form a trench for interconnection. The etching is performed until the silicon oxycarbide layer composing the bottom interlayer insulation layer is exposed. Next, at a certain region of the trench for interconnection, the silicon oxycarbide layer exposed at the low surface of the trench is patterned by etching to form a contact hole. The time of etching the contact hole by the etch selectivity of the layers is important for increasing the process margin. A metal CVD process is performed to fill the contact hole and the trench for interconnection. As the metal layer, it is possible to use Copper that can decrease the resistance or tungsten having a good gap-fill characteristic. The metal layer is stacked on the organic polymer layer. Thus, in order to complete the interconnection, the metal layer stacked on the organic polymer layer is removed by the CMP process so that the metal layer remains only in the trench and the contact hole.

In the case that the contact is formed as in the preferred embodiment, the silicon oxycarbide layer has a low dielectric constant, so that it is possible to prevent increase in the parasitic capacitance between the contact plugs, even in the case that the density of contact formation is high. Also, it is possible to decrease the parasitic capacitance between the interconnections of top and bottom layers even in the case that an interlayer insulation layer is thin.

According to the present invention, in a semiconductor device, it is possible to form a clear photoresist pattern on a silicon oxycarbide layer by preventing a conventional footing phenomenon while the silicon oxycarbide layer is patterned. Consequently, a fine pattern can be formed accurately on the silicon oxycarbide layer, and the parasitic capacitance between the interlayer interconnections or contact plugs can be effectively prevented.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of fabricating a semiconductor device having a low dielectric interlayer insulation layer, the method comprising:

installing a semiconductor substrate in a chamber;

introducing a layer formation source gas into the chamber, the layer formation source gas being selected to provide atoms used in forming a silicon oxycarbide layer on the substrate, the layer formation source gas comprising at least one of: (i) at least one of $N_2O$ and $O_2$ for supplying oxygen, (ii) a gas containing a methyl silane group selected from the group consisting of a gas containing a monomethyl silane group, a gas containing a dimethyl silane group, a gas containing a trimethyl silane group, and a gas containing tetramethyl silane, and (iii) another organic silicon gas;

introducing a first plasma source gas into the chamber;

performing plasma-enhanced chemical vapor deposition (PECVD) on the substrate in the chamber while the layer formation source gas and the first plasma source gas are being introduced into the chamber at a temperature of about 300 to 400 degrees C., the PECVD resulting in completely forming a silicon oxycarbide layer as the low dielectric interlayer insulation layer on the substrate;

introducing a second plasma source gas into the chamber without the layer formation source gas at a temperature of about 250 to 400 degrees C., the second plasma source gas being at least one gas selected from the group consisting of He, $H_2$, $N_2O$, $NH_3$, $N_2$, $O_2$ and Ar;

using the second plasma source gas, treating the completely formed silicon oxycarbide layer with plasma; and stacking photoresist on the plasma-treated oxycarbide layer and patterning the resultant structure.

2. The method of claim 1, wherein the layer formation source gas comprises nitrogen atoms.

3. The method of claim 1, wherein forming the silicon oxycarbide layer and treating with plasma are performed in situ in the chamber.

4. The method of claim 3, wherein forming the silicon oxycarbide layer and treating with plasma are performed under conditions of a pressure of 1 to 10 Torr and a temperature of 300 to 400° C.

5. The method of claim 1, wherein forming the silicon oxycarbide layer and treating with plasma are performed under conditions of a pressure of 1 to 10 Torr and a temperature of 300 to 400° C.

6. The method of claim 1, wherein the photoresist is a chemical amplification type photoresist which generates hydrogen ions (H+) in a case of light exposure.

7. The method of claim 6, wherein the patterning comprises:

exposing the photoresist to light below a photo mask;

performing a post exposure bake; and developing the photoresist.

8. The method of claim 1, wherein the patterning comprises:

exposing the photoresist to light below a photo mask;

performing a post exposure bake; and developing the photoresist.

9. A method of fabricating a semiconductor device having a low dielectric interlayer insulation layer, comprising:

installing a semiconductor substrate in a chamber;

introducing a layer formation source gas into the chamber, the layer formation source gas being selected to provide atoms used in forming a silicon oxycarbide layer on the substrate, the layer formation source gas comprising at least one of: (i) at least one of $N_2O$ and $O_2$ for supplying oxygen, (ii) a gas containing a methyl silane group selected from the group consisting of a gas containing a monomethyl silane group, a gas containing a dimethyl silane group, a gas containing a trimethyl silane group, and a gas containing tetramethyl silane, and (iii) another organic silicon gas;

introducing a first plasma source gas into the chamber;

performing plasma-enhanced chemical vapor deposition (PECVD) on the substrate in the chamber while the layer formation source gas and the first plasma source gas are being introduced into the chamber at a temperature of about 300 to 400 degrees C., the PECVD resulting in staking a completely forming a silicon oxycarbide layer (SiOC) as the low dielectric interlayer insulation layer on the substrate;

introducing a second plasma source gas into the chamber without the layer formation source gas at a temperature of about 250 to 400 degrees C., the second plasma source gas being at least one gas selected from the group consisting of He, $H_2$, $N_2O$, $NH_3$, $N_2$, $O_2$ and Ar;

using the second plasma source gas, treating the completely formed silicon oxycarbide layer with plasma; and forming an interconnection at the silicon oxycarbide layer using a damascene process.

10. The method of claim 9, wherein $H_2$-plasma is used as the second plasma source gas, and further comprising forming an insulation layer for capping on the silicon oxycarbide layer after treating with plasma and before forming the interconnection.

11. The method of claim 10, wherein the layer formation source gas comprises at least one of a silane gas and a tetraethylorthosilicate (TEOS) gas.

12. The method of claim 10, wherein treating with the second plasma source gas is performed under a $H_2$-ambient at a temperature of 250 to 400° C. and a pressure of 1 to 10 Torr and by applying a radio frequency electric field.

13. The method of claim 10, wherein forming the interconnection using the damascene process comprises:

forming a photoresist pattern over the silicon oxycarbide layer;

forming a groove at the top of the silicon oxycarbide layer using the photoresist pattern as an etch mask;

removing the photoresist pattern by an ashing method using $O_2$-plasma;

sequentially stacking a barrier metal and a metal layer for interconnection at the groove-formed substrate to fill the groove; and removing the metal layer for interconnection stacked at the top surface of the silicon oxycarbide layer using a chemical mechanical polishing (CMP) process.

14. The method of claim 13, wherein the metal layer for interconnection is formed of copper.

15. The method of claim 11, wherein the damascene process comprises forming the groove and then forming a contact hole at a region of the groove.

16. The method of claim 9, further comprising forming an organic polymer layer at the silicon oxycarbide layer using a coating method after treating with plasma and before forming the interconnection.

17. The method of claim 16, wherein forming the organic polymer layer is performed by a coating method at the substrate and then curing is performed at a high temperature of 400 to 450° C.

18. The method of claim 16, wherein the damascene process is performed by a dual damascene method comprising forming a groove at the organic polymer layer using a patterning process and forming a contact hole at the silicon oxycarbide layer at a region of the groove through a patterning process.

* * * * *

UNITED STATES PATENT AND TRADEMARK OFFICE
CERTIFICATE OF CORRECTION

PATENT NO.     : 6,936,533 B2
DATED          : August 30, 2005
INVENTOR(S)    : Jae-Hak Kim et al.

It is certified that error appears in the above-identified patent and that said Letters Patent is hereby corrected as shown below:

Column 12,
Line 4, delete "staking" and insert -- stacking --.

Signed and Sealed this

Thirteenth Day of December, 2005

JON W. DUDAS
*Director of the United States Patent and Trademark Office*